(12) United States Patent
Collins et al.

(10) Patent No.: US 8,138,607 B2
(45) Date of Patent: Mar. 20, 2012

(54) METAL FILL STRUCTURES FOR REDUCING PARASITIC CAPACITANCE

(75) Inventors: David S. Collins, Williston, VT (US); Howard S. Landis, Underhill, VT (US); Anthony K. Stamper, Williston, VT (US); Janet M. Wilson, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 107 days.

(21) Appl. No.: 12/632,838

(22) Filed: Dec. 8, 2009

(65) Prior Publication Data

US 2010/0264545 A1 Oct. 21, 2010

Related U.S. Application Data

(60) Provisional application No. 61/169,392, filed on Apr. 15, 2009.

(51) Int. Cl.
*H01L 23/48* (2006.01)

(52) U.S. Cl. ........ 257/773; 257/774; 257/758; 257/760; 257/E21.589; 257/E23.151; 257/E23.011

(58) Field of Classification Search .................. 257/773, 257/774, 758, 760, E21.589, E23.011, E23.151
See application file for complete search history.

(56) References Cited

U.S. PATENT DOCUMENTS

| | | | |
|---|---|---|---|
| 5,350,886 A * | 9/1994 | Miyazaki et al. | ............. 174/250 |
| 5,378,927 A | 1/1995 | McAllister et al. | |
| 6,351,026 B2 | 2/2002 | Hirasawa et al. | |
| 6,434,016 B2 | 8/2002 | Zeng et al. | |
| 6,495,917 B1 | 12/2002 | Ellis-Monaghan et al. | |
| 6,556,453 B2 | 4/2003 | Figueroa et al. | |
| 6,559,543 B1 | 5/2003 | Dunham et al. | |
| 6,900,395 B2 | 5/2005 | Jozwiak et al. | |
| 7,015,582 B2 | 3/2006 | Landis | |
| 7,224,069 B2 | 5/2007 | Chen et al. | |
| 7,812,424 B2 * | 10/2010 | Barth et al. | ................... 257/532 |
| 2005/0127496 A1 | 6/2005 | Kwon et al. | |
| 2005/0150106 A1 | 7/2005 | Long et al. | |
| 2007/0176295 A1 | 8/2007 | Chinthakindi et al. | |

* cited by examiner

*Primary Examiner* — Andy Huynh
(74) *Attorney, Agent, or Firm* — Scully, Scott, Murphy & Presser, P.C.; Anthony J. Canale

(57) ABSTRACT

Vertically-staggered-level metal fill structures include inner contiguous metal fill structures and outer contiguous metal fill structures. A dielectric material portion is provided between each contiguous metal fill structure. Vertical extent of each contiguous metal fill structure is limited up to three vertically adjoining metal interconnect levels, thereby limiting the capacitance of each contiguous metal fill structure. Capacitive coupling between the contiguous metal fill structures and the metal interconnect structures is minimized due to the fragmented structure of contiguous metal fill structures.

20 Claims, 6 Drawing Sheets

METAL FILL STRUCTURES FOR REDUCING PARASITIC CAPACITANCE

FIELD OF THE INVENTION

The present invention relates to metal fill structures, and particularly to metal fill structures that provide reduced capacitive coupling.

BACKGROUND OF THE INVENTION

Metal fill structures extending from the lowest level metal line level to the uppermost level metal line level are employed to protect semiconductor structures within the enclosed area. While providing effective protection against moisture or impurity ingress, such a metal fill structures provides a large capacitance due to the large volume of conductive material. Capacitive coupling between metal interconnect structures and the metal fill structures may slow signal propagation in the metal interconnect structures, thereby degrading performance of a semiconductor chip.

SUMMARY OF THE INVENTION

The present invention provides a structure that includes vertically-staggered-level metal fill structures containing a plurality of contiguous metal fill structures that are vertically separated.

Vertically-staggered-level metal fill structures include an inner metal fill structure group and an outer metal fill structure group. The vertically-staggered-level metal fill structures may be enclosed in a chip guard ring structure that extends from a top surface of a semiconductor substrate to a topmost surface of a back-end-of-line dielectric material stack. The inner metal fill structure group is located inside the outer metal fill structure group. The inner metal fill structure group includes at least two sets of inner contiguous metal fill structures that are vertically separated. The outer metal fill structure group includes at least two sets of outer contiguous metal fill structures that are vertically separated. A dielectric material portion is provided between each pair of contiguous metal fill structures. The vertical extent of each contiguous metal fill structure is limited up to three vertically adjoining metal interconnect levels, thereby limiting the capacitance of each contiguous metal fill structure. Capacitive coupling between the contiguous metal fill structures and the metal interconnect structures is minimized due to the fragmented structure of contiguous metal fill structures.

According to the present invention, a semiconductor structure is provided, which includes: an optional semiconductor device located on a semiconductor substrate; a first dielectric material portion located directly on the semiconductor substrate; an inner metal fill structure group located on a periphery of the first dielectric material portion and including at least two sets of inner contiguous metal fill structures that are vertically separated, wherein each inner contiguous metal fill structure includes no more than 3 metal interconnect levels and separated among one another; a second dielectric material portion located on an outer periphery of the inner metal fill structure group; and an outer metal fill structure group embedded in the second dielectric material portion and including at least two sets of outer contiguous metal fill structures that are vertically separated, wherein each outer contiguous metal fill structures includes no more than 3 metal interconnect levels and separated among one another, wherein each of the at least two sets of inner contiguous metal fill structures comprises a different set of metal interconnect levels than any set of metal interconnect levels that constitute an entirety of any of the at least two sets of outer contiguous metal fill structures.

BRIEF DESCRIPTION OF THE DRAWINGS

FIG. 1A is a vertical cross-sectional view along the plane A-A' in FIGS. 1B and 1C. FIGS. 1B and 1C are horizontal cross-sectional views along the plane B-B' or C-C' of the first exemplary structure in FIG. 1A.

DETAILED DESCRIPTION OF THE INVENTION

Figure 1A:
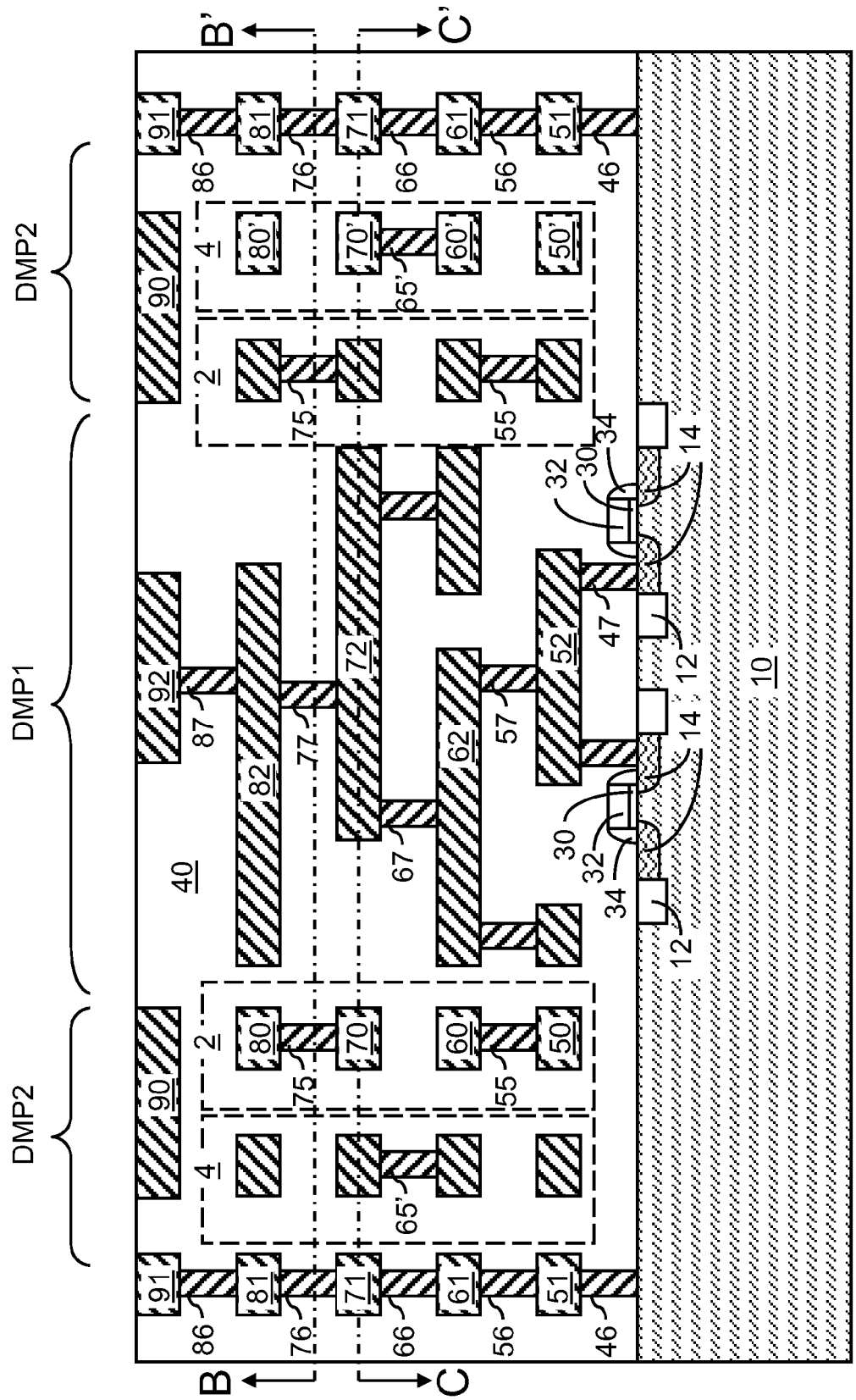
FIGS. 1A-1C are various views of a first exemplary structure according to a first embodiment of the present invention.

As stated above, the present invention relates to electromigration resistant metal interconnect structures including a metal line and a conductive via, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element.

As used herein, a "level" refers to a single range of distance from a top surface of a substrate that extend between a top surface of a single metal via and a bottom surface of the same single metal via or between a top surface of a single metal line and a bottom surface of the same single metal line. For example, a level may be a first via level, a second via level, a third via level, etc. Likewise, a level may be a first line level, a second line level, a third line level, etc.

As used herein, a "set" of metal fill structures refers to a collection of metal fill structures extending over the same levels or over the same level. Thus, each metal fill structure in the same "set" of metal fill structures vertically extends over the same levels or over the same level. Each metal fill structure in a "set" of metal fill structures may extend over a single level or multiple levels that are contiguous, i.e., vertically adjoined among one another in a structural implementation.

Figure 1B:
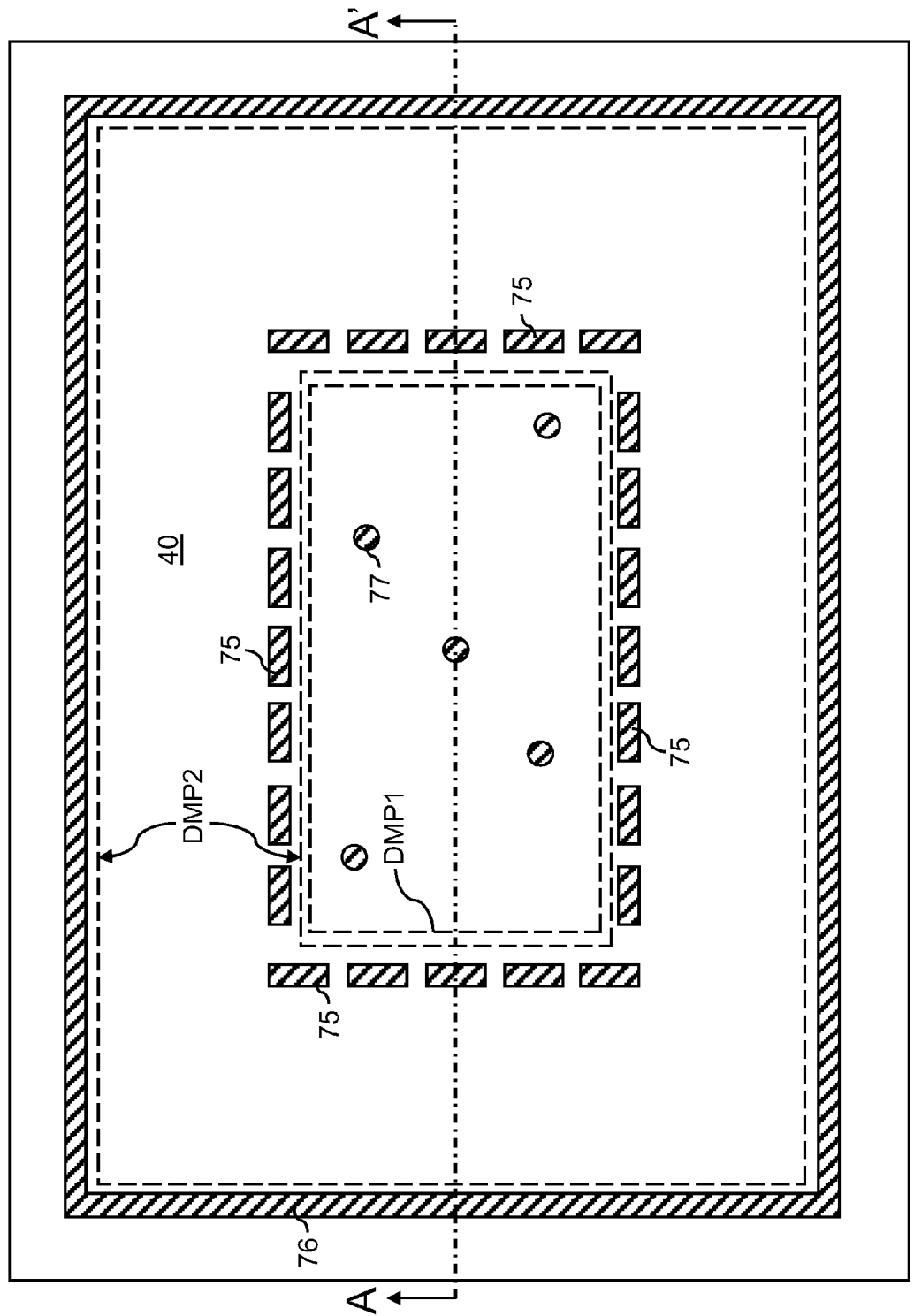
Figure 1C:
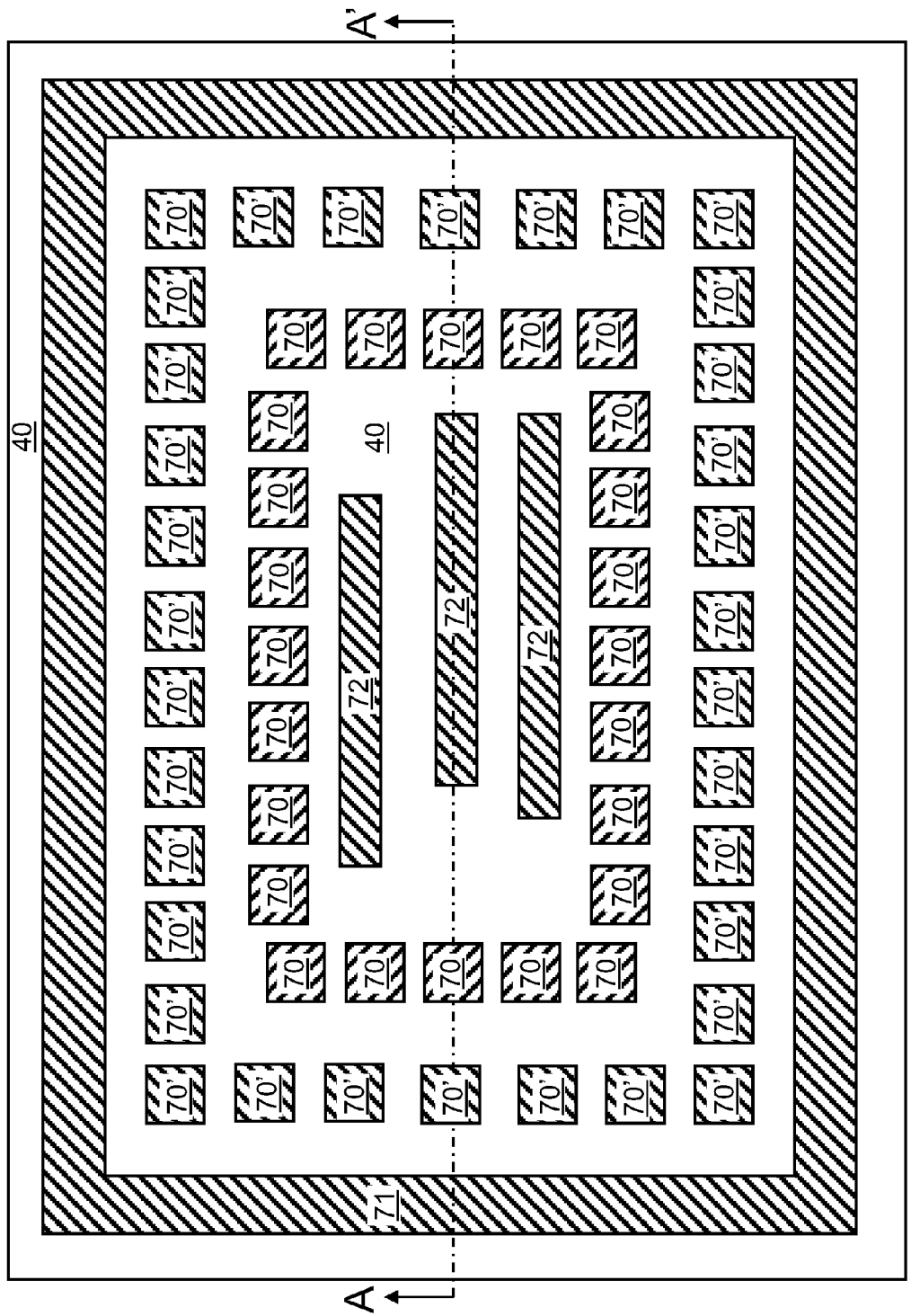

Referring to FIGS. 1A-1C, a first exemplary structure according to a first embodiment of the present invention comprises a semiconductor substrate 10, which comprises a semiconductor material. At least one semiconductor device may be formed on the semiconductor substrate 10. For example, the optional semiconductor device may include a field effect transistor including source and drain regions 14, a gate dielectric 30, a gate electrode 32, and a gate spacer 34. Shallow trench isolation structures 12 may provide electrical separation between semiconductor devices. The optional semiconductor device may be formed directly on the top surface of the semiconductor substrate 10.

The semiconductor material for the semiconductor substrate 10 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon.

Dielectric material layers 40 are formed on the top surface of the semiconductor substrate 10 and the optional semiconductor device. The dielectric material layers 40 may comprise an oxide based conventional dielectric material, which has a dielectric constant k from about 3.6 to about 3.9, or a low-k dielectric material, which has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™" The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the dielectric material layers 40. The dielectric material layers 40 may comprise the same material throughout, or the dielectric material layers 40 may comprise a stack of at least two of the oxide based conventional dielectric material, the spin-on low-k dielectric material, and the CVD low-k dielectric material.

Metal interconnect structures are formed within in the dielectric material layers 40. The metal interconnect structures are embedded in the dielectric material layers 40 by alternating deposition of a dielectric material layer and formation of metal interconnect structures. For example, via level dielectric material layers and line level dielectric material layers are alternately deposited with formation of metal interconnect structures therebetween. Dielectric passivation layers that provide protection against diffusion of moisture may be formed between two adjacent dielectric material layers.

For example, the metal interconnect structures may include at least one first-via-level metal via 47, at least one first-line-level metal line 52, at least one second-via-level metal via 57, at least one second-line-level metal line 62, at least one third-via-level metal via 67, at least one third-line-level metal line 72, at least one fourth-via-level metal via 77, at least one fourth-line-level metal line 82, at least one fifth-via-level metal via 87, and at least one fifth-line-level metal line 92. While the present invention is described with an exemplary set of metal interconnect structure including five via levels and five line levels, embodiments of the present invention in which any other number of via levels and line levels are employed are also contemplated herein. The portion of the dielectric material layers 40 that embed the metal interconnect structures (47, 52, 57, 62, 67, 72, 77, 82, 87, 92) is referred to a first dielectric material portion DMP1.

An inner metal fill structure group 2 and an outer metal fill structure group 4 are formed as embedded structures in the dielectric material layers 40. The inner metal fill structure group 2 includes at least two sets of inner contiguous metal fill structures. Each set of inner contiguous metal fill structures includes a plurality of contiguous metal fill structures formed in the same set of at least one vertically adjacent level. Different sets of inner contiguous metal fill structures employ different levels. Inner contiguous metal fill structures employing the same set of levels belong to the same set of inner metal fill structures. Likewise, each set of outer contiguous metal fill structures includes a plurality of contiguous metal fill structures formed in the same set of at least one vertically adjacent level. Different sets of outer contiguous metal fill structures employ different levels. Outer contiguous metal fill structures employing the same set of levels belong to the same set of outer metal fill structures.

Each inner contiguous metal fill structure is a single contiguous structure. For example, a lower inner contiguous metal fill structure includes a first-line-level metal structure 50, a second-via-level metal structure 55, and a second-line-level metal structure 60. An upper inner contiguous metal fill structure includes a third-line-level metal structure 70, a fourth-via-level metal structure 75, and a fourth-line-level metal structure 80. The entirety of the lower inner contiguous metal fill structure constitutes a first set of inner contiguous metal fill structures. The entirety of the upper inner contiguous metal fill structure constitutes a second set of inner contiguous metal fill structures. The upper inner contiguous metal fill structures (70, 75, 80) are vertically separated from the lower inner contiguous metal fill structures (50, 55, 60) by a sub-portion of a second dielectric material portion DMP2, which is a portion of the dielectric material layers 40 located outside and laterally surrounding the first dielectric material portion DMP1. The sub-portion of the second dielectric material portion DMP2 is located between the second-line-level metal structure 60 and the third-line-level metal structure 70.

The second-via-level metal structure 55 vertically abuts the first-line-level metal structure 50 and the second-line-level metal structure 60. The fourth-via-level metal structure 75 vertically abuts the third-line-level metal structure 70 and the fourth-line-level metal structure 80. The upper inner contiguous metal fill structures (70, 75, 80) overlies the lower inner contiguous metal fill structures (50, 55, 60). Each of the inner contiguous metal fill structures is vertically or laterally separated from other inner contiguous metal fill structures by the second dielectric material portion DMP2. The at least two sets of inner contiguous metal fill structures are located on the periphery of the first dielectric material portion DMP1.

Each of the lower inner contiguous metal fill structures (50, 55, 60) and the upper inner contiguous metal fill structures (70, 75, 80) comprises a first line-level metal structure, a via-level metal structure, and a second line-level metal structure. In the case of the lower inner contiguous metal fill structures (50, 55, 60), the first line-level metal structure is the first-line-level metal structure 50, the via-level metal structure is the second-via-level metal structure 55, and the second line-level metal structure is the second-line-level metal structure 60. In the case of the upper inner contiguous metal fill structures (70, 75, 80), the first line-level metal structure is the third-line-level metal structure 70, the via-level metal structure is the fourth-via-level metal structure 75, and the second line-level metal structure is the fourth-line-level metal structure 80.

Each outer contiguous metal fill structure is a single contiguous structure. A primary outer contiguous metal fill structure includes another second-line-level metal structure 60', a third-via-level metal structure 65', and another third-line-level metal structure 70'. Another outer contiguous metal fill structures include another first-line-level metal structure 50' that underlies the primary outer contiguous metal fill structures (60', 65', 70'). Yet another second metallic lateral exposure structure includes another fourth-line-level metal structure 80' that overlies the primary outer contiguous metal fill structures (60', 65', 70'). The other first-line-level metal structure 50' is vertically separated from the primary outer contiguous metal fill structures (60', 65', 70') by another sub-portion of the second dielectric material portion DMP2. The other sub-portion of the second dielectric material portion DMP2 is located between the other first-line-level metal structure 50' and the second-line-level metal structure 60'. The yet other outer contiguous metal fill structures 80' is vertically separated from the primary outer contiguous metal fill structures (60', 65', 70') by yet another sub-portion of the second dielectric material portion DMP2. The yet other sub-portion of the second dielectric material portion DMP2 is located between the other third-line-level metal structure 70' and the other fourth-line-level metal structure 80'.

The third-via-level metal structure 65' vertically abuts the other second-line-level metal structure 60' and the third-line-level metal structure 70'. The third-via-level metal structure 65' vertically abuts the other second-line-level metal structure 60' and the other third-line-level metal structure 70'. Each outer contiguous metal fill structure is vertically separated from other outer contiguous metal fill structures by the second dielectric material portion DMP2. The outer contiguous metal fill structures are embedded in the second dielectric material portion DMP2.

The primary outer contiguous metal fill structures (60', 65', 70') comprises a first line-level metal structure, a via-level metal structure, and an second line-level metal structure. In this case, the first line-level metal structure is the other second-line-level metal structure 60', the via-level metal structure is the third-via-level metal structure 65', and the second line-level metal structure is the other third-line-level metal structure 70'.

Each set among the at least two sets of inner contiguous metal fill structures and the at least two sets of outer contiguous metal fill structures comprises a unique set of metal interconnect levels. For example, the lower inner contiguous metal fill structures (50, 55, 60) comprises the set of metal interconnect levels consisting of the first line level, the second via level, and the second line level. The upper inner contiguous metal fill structures (70, 75, 80) comprises the set of metal interconnect levels consisting of the third line level, the fourth via level, and the fourth line level. The primary outer contiguous metal fill structures (60', 65', 70') comprises the set of metal interconnect levels consisting of the second line level, the third via level, and the third line level. The other outer contiguous metal fill structures consist of the first line level. The yet other outer contiguous metal fill structures consist of the fourth line level. The overall composition of the metal interconnect levels is a vertically staggered set of metal interconnect levels in which there is a vertical overlap of one level for each overlapping pair of one of the at least two sets of inner contiguous metal fill structures and one of the at least two sets of outer contiguous metal fill structures.

Other metal fill structures overlying or underlying the inner metal fill structure group 2 of the at least two sets of inner contiguous metal fill structures and the outer metal fill structure group 4 of the at least two second lateral metallic enclosure structure may be formed. For example, a fifth level metal fill structures 90 may be formed along the periphery of the first dielectric material portion DMP1 over the inner metal fill structure group 2 and the outer metal fill structure group 4.

The first exemplary structure may further comprise a chip guard ring that laterally surrounds and encloses the second dielectric material portion DMP2. The chip guard ring vertically abuts a top surface of the semiconductor substrate 10 and a topmost surface of the second dielectric material portion DMP2 of the dielectric material layers 40. The chip guard ring is a single contiguous piece, and may comprise a first-via-level guard ring via 46, a first-line-level guard ring line 51, a second-via-level guard ring via 56, a second-line-level guard ring line 61, a third-via-level guard ring via 66, a third-line-level guard ring line 71, a fourth-via-level guard ring via 76, a fourth-line-level guard ring line 81, a fifth-via-level guard ring via 86, and a fifth-line-level guard ring line 91.

Each level of the chip guard ring structure may be formed at the same time as the formation of the metal interconnect structures and metal fill structures at the same level. Thus, all metallic structures in the same level in the first exemplary structure may be formed at the same time, and the first exemplary structure is formed layer by layer from bottom to top.

All via level metallic structures within the same via level are located within a same distance range from a top surface of the semiconductor substrate 10. Likewise, all line level metallic structures within the same line level are located within a same distance range from the top surface of the semiconductor substrate 10. Thus, each set of via level metallic structures and each set of line level metallic structures may be stratified. In this case, each set of via level metallic structures in the same via level have bottom surfaces that are substantially coplanar with top surfaces of the set of line level metallic structures in the line level directly underneath, if present, and have top surfaces that are substantially coplanar with bottom surfaces of the set of line level metallic structures in the line level located directly above, if present. Likewise, each set of line level metallic structures in the same line level have bottom surfaces that are substantially coplanar with top surfaces of the set of via level metallic structures in the via level directly underneath, if present, and have top surfaces that are substantially coplanar with bottom surfaces of the set of via level metallic structures in the via level located directly above, if present.

While the present invention is described with a structure having five via levels and five line levels, embodiments of the present invention in which different numbers of via levels and/or different numbers of line levels are explicitly contemplated herein. In this case, each set among the at least two sets of inner contiguous metal fill structures in an inner metal fill structure group 2 comprises a different set of metal interconnect levels than any set of metal interconnect levels that constitute an entirety of any of at least two sets of outer contiguous metal fill structures in an outer metal fill structure group 4. The outer metal fill structure group 4 is located outside, and laterally encloses the inner metal fill structure group 2.

Further, a variation of the first exemplary structure in which the set of levels employed for the inner metal fill structure group 2 and the set of levels employed for the outer metal fill structure group 4 are exchanged is explicitly contemplated herein. For example, an inner metal fill structure group 2 may include metallic structures in the first line level, the second line level, the third via level, the third line level, and the fourth line level as the outer metal fill structure group 4 in FIGS. 1A-1C, and an outer metal fill structure group 4 may include metallic structures in the first line level, the second via level, the second line level, the third line level, the fourth via level, and the fourth line level as the inner metal fill structure group 2 in FIGS. 1A-1C.

Figure 2:
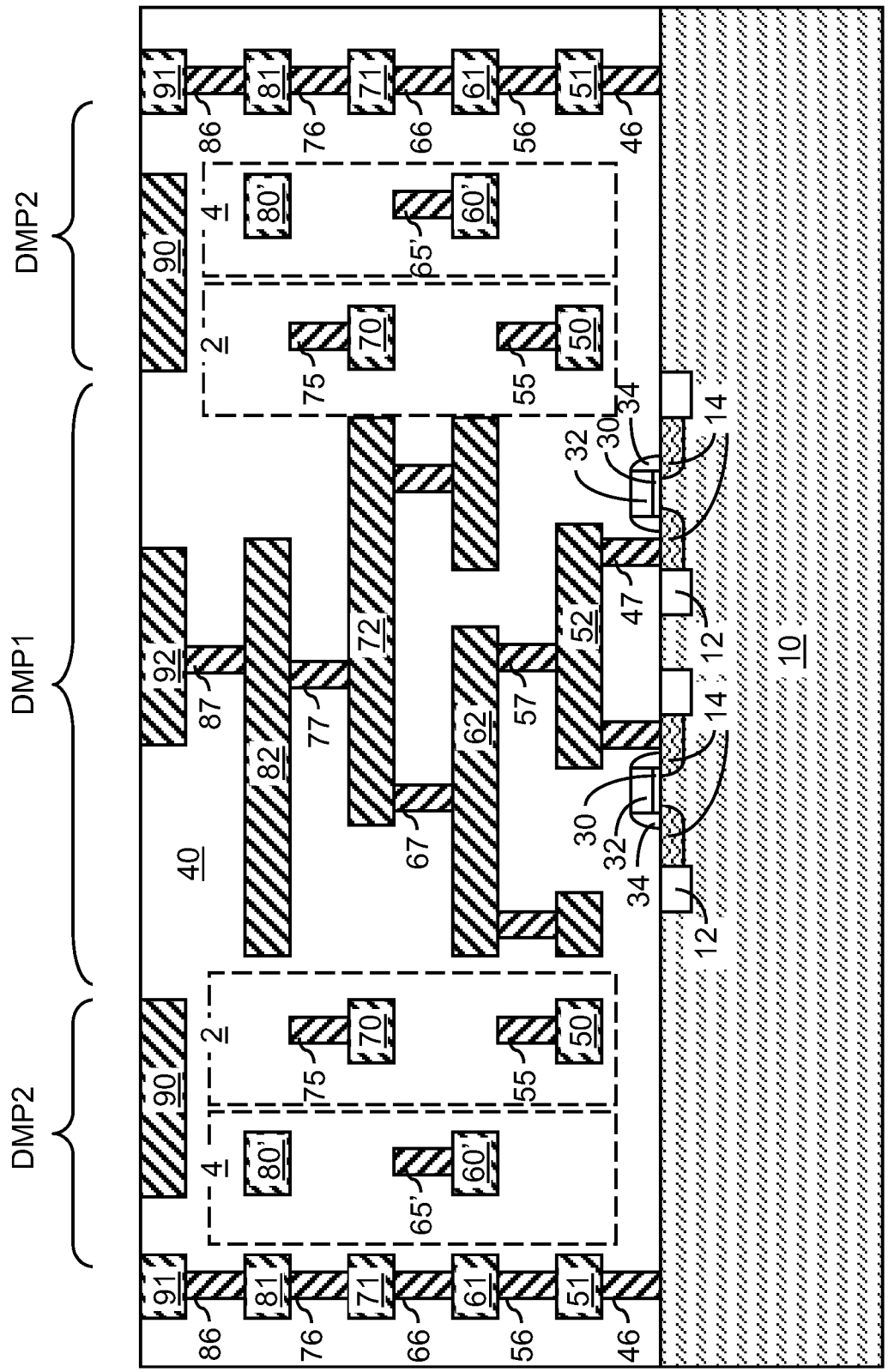
FIG. 2 is a vertical cross-sectional view of a second exemplary structure according to a second embodiment of the present invention.

Referring to FIG. 2, a second exemplary structure according to a second embodiment of the present invention comprises a semiconductor substrate 10, which may be the same as in the first embodiment. A semiconductor device may be formed on the semiconductor substrate 10 in the same manner as in the first embodiment.

Dielectric material layers 40 and metal interconnect structures (47, 52, 57, 62, 67, 72, 77, 82, 87, 92) are formed on the top surface of the semiconductor substrate 10 and the optional semiconductor device in the same manner as in the first embodiment. The composition and thickness of each of the dielectric material layers 40 and the metal interconnect structures (47, 52, 57, 62, 67, 72, 77, 82, 87, 92) may be the same as in the first embodiment. The dielectric material layers 40 and the metal interconnect structures (47, 52, 57, 62, 67, 72, 77, 82, 87, 92) may be formed in the same manner as in the first embodiment.

An inner metal fill structure group 2 and an outer metal fill structure group 4 are formed as embedded structures in the dielectric material layers 40. Each inner contiguous metal fill structures is a single contiguous structure. A lower inner contiguous metal fill structure includes a first-line-level metal structure 50 and a second-via-level metal structure 55. An upper inner contiguous metal fill structure includes a third-line-level metal structure 70 and a fourth-via-level metal structure 75. The upper inner contiguous metal fill structures (70, 75) are vertically separated from the lower inner contiguous metal fill structures (50, 55) by a sub-portion of a second dielectric material portion DMP2, which is a portion of the dielectric material layers 40 located outside and laterally surrounding the first dielectric material portion DMP1. The sub-portion of the second dielectric material portion DMP2 is located between the second-via-level metal structure 55 and the third-line-level metal structure 70.

The second-via-level metal structure 55 vertically abuts the first-line-level metal structure 50. The fourth-via-level metal structure 75 vertically abuts the third-line-level metal structure 70. The upper inner contiguous metal fill structures (70, 75) overlie the lower inner contiguous metal fill structures (50, 55). Lower inner contiguous metal fill structures (70, 75) and upper inner contiguous metal fill structures (50, 55) are collectively referred to as at least two sets of inner contiguous metal fill structures. Each set among the at least two sets of inner contiguous metal fill structures is vertically separated from any other of the at least two sets of inner contiguous metal fill structures by the second dielectric material portion DMP2. The inner contiguous metal fill structures are located on the outer periphery of the first dielectric material portion DMP1.

Each of the lower inner contiguous metal fill structures (50, 55) and the upper inner contiguous metal fill structures (70, 75) comprises a line-level metal structure and a via-level metal structure. In the case of the lower inner contiguous metal fill structures (50, 55), the line-level metal structure is the first-line-level metal structure 50, and the via-level metal structure is the second-via-level metal structure 55. In the case of the upper inner contiguous metal fill structures (70, 75), the line-level metal structure is the third-line-level metal structure 70, and the via-level metal structure is the fourth-via-level metal structure 75.

Each outer contiguous metal fill structure is a single contiguous structure. A primary outer contiguous metal fill structures include a second-line-level metal structure 60' and a third-via-level metal structure 65'. Another outer contiguous metal fill structures include a fourth-line-level metal structure 80' that overlies the primary outer contiguous metal fill structures (60', 65'). The fourth-line-level metal structure 80' is vertically separated from the primary outer contiguous metal fill structures (60', 65') by another sub-portion of the second dielectric material portion DMP2. The other sub-portion of the second dielectric material portion DMP2 is located between the other third-via-level metal structure 65' and the other fourth-line-level metal structure 80'.

Each third-via-level metal structure 65' vertically abuts a second-line-level metal structure 60'. Each outer contiguous metal fill structure is vertically separated from any other outer contiguous metal fill structures by the second dielectric material portion DMP2. Each of the outer contiguous metal fill structures in the outer metal fill structure group 4 is embedded in the second dielectric material portion DMP2.

Each primary outer contiguous metal fill structure (60', 65') comprises a line-level metal structure and a via-level metal structure. Specifically, the line-level metal structure is the second-line-level metal structure 60', and the via-level metal structure is the third-via-level metal structure 65'.

Each set among the at least two sets of inner contiguous metal fill structures and the at least two sets of outer contiguous metal fill structures comprises a different set of metal interconnect levels from the rest of the metal fill structures. Specifically, the lower inner contiguous metal fill structures (50, 55) comprises the set of metal interconnect levels consisting of the first line level and the second via level. The upper inner contiguous metal fill structures (70, 75) comprises the set of metal interconnect levels consisting of the third line level and the fourth via level. The primary outer contiguous metal fill structures (60', 65') comprises the set of metal interconnect levels consisting of the second line level and the third via level. The other outer contiguous metal fill structures consist of the fourth line level. The overall composition of the metal interconnect levels is a vertically staggered set of metal interconnect levels in which there is no vertical overlap between any of the at least two sets of inner contiguous metal fill structures and any of the at least two sets of outer contiguous metal fill structures.

Other sets of contiguous metal fill structures overlying or underlying the inner metal fill structure group 2 or the outer metal fill structure group 4 may be formed as in the first embodiment. The second exemplary structure may further comprise a chip guard ring as in the first embodiment. Embodiments of the present invention in which different numbers of via levels and/or different numbers of line levels are explicitly contemplated herein. In this case, each of the at least two sets of inner contiguous metal fill structures in an inner metal fill structure group 2 comprises a different set of metal interconnect levels than any set of metal interconnect levels that constitute an entirety of any of at least two sets of outer contiguous metal fill structures in an outer metal fill structure group 4. The outer metal fill structure group 4 is located outside, and laterally encloses the inner metal fill structure group 2. A variation of the second exemplary structure in which the set of levels employed for the inner metal fill structure group 2 and the set of levels employed for the outer metal fill structure group 4 are exchanged is also explicitly contemplated herein.

Figure 3:
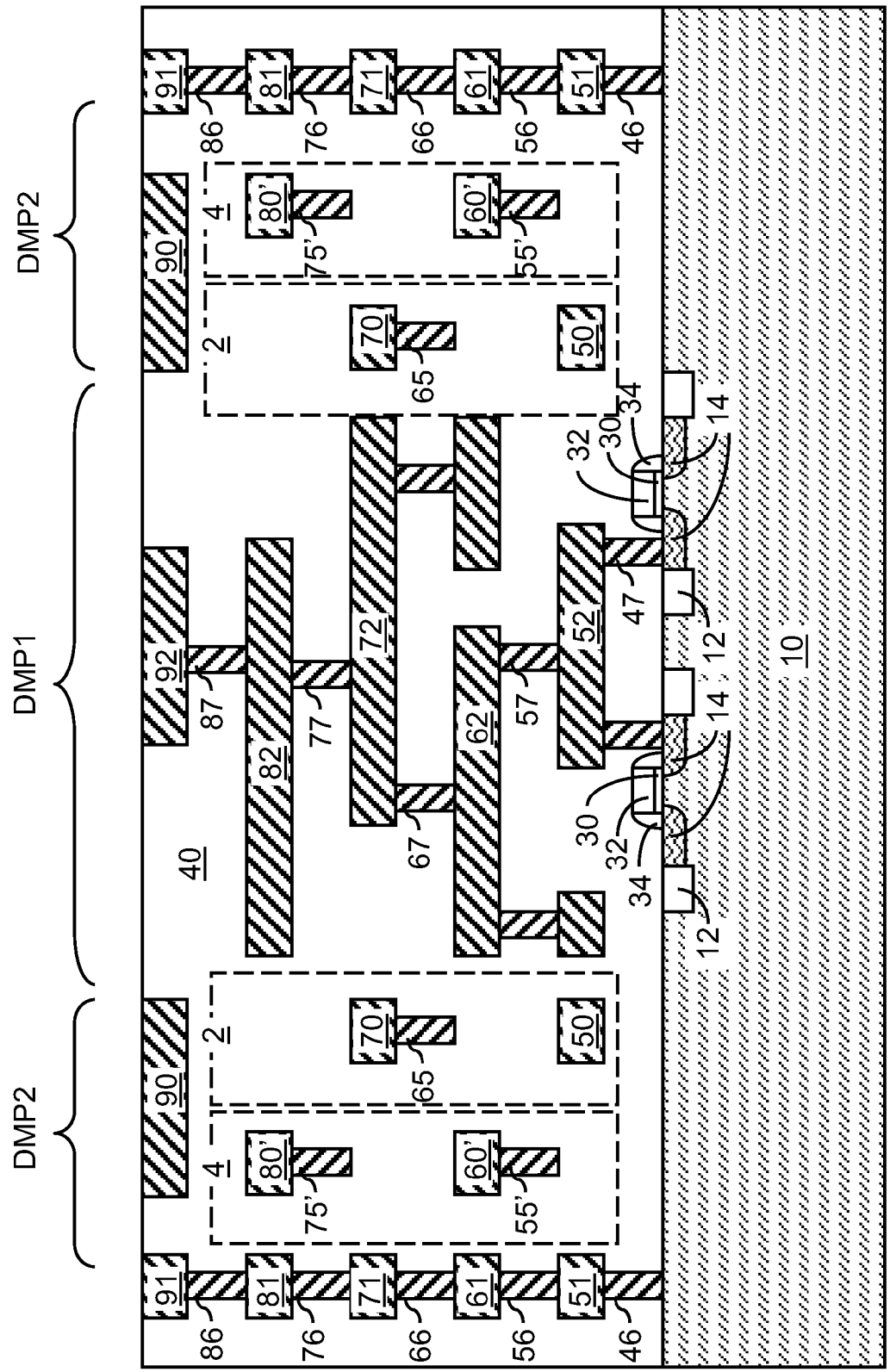
FIG. 3 is a vertical cross-sectional view of a third exemplary structure according to a third embodiment of the present invention.

Referring to FIG. 3, a third exemplary structure according to a third embodiment of the present invention comprises a semiconductor substrate 10, which may be the same as in the first embodiment. A semiconductor device may be formed on the semiconductor substrate 10 in the same manner as in the first embodiment.

Dielectric material layers 40 and metal interconnect structures (47, 52, 57, 62, 67, 72, 77, 82, 87, 92) are formed on the top surface of the semiconductor substrate 10 and the optional semiconductor device in the same manner as in the first embodiment. The composition and thickness of each of the dielectric material layers 40 and the metal interconnect structures (47, 52, 57, 62, 67, 72, 77, 82, 87, 92) may be the same as in the first embodiment. The dielectric material layers 40 and the metal interconnect structures (47, 52, 57, 62, 67, 72, 77, 82, 87, 92) may be formed in the same manner as in the first embodiment.

An inner metal fill structure group 2 and an outer metal fill structure group 4 are formed as embedded structures in the dielectric material layers 40. Each inner contiguous metal fill structure is a single contiguous structure. Each lower inner contiguous metal fill structure includes a first-line-level metal structure 50. Each upper inner contiguous metal fill structure includes a third-via-level metal structure 65 and a third-line-level metal structure 70. The upper inner contiguous metal fill structures (65, 70) is vertically separated from the first-line-level metal structure 50 by a sub-portion of a second dielectric material portion DMP2, which is a portion of the dielectric material layers 40 located outside and laterally surrounding the first dielectric material portion DMP1. The sub-portion of the second dielectric material portion DMP2 is located between the first-line-level metal structure 50 and the third-via-level metal structure 65.

The upper inner contiguous metal fill structures (65, 70) overlie the lower inner contiguous metal fill structures, which are the first-line-level metal structures 50. Lower inner contiguous metal fill structures and upper inner contiguous metal fill structures (65, 70) are collectively referred to as at least two sets of inner contiguous metal fill structures. Each set among the at least two sets of inner contiguous metal fill structures is vertically separated from any other of the at least two sets of inner contiguous metal fill structures by the second dielectric material portion DMP2. The inner contiguous metal fill structures are located on the outer periphery of the first dielectric material portion DMP1.

Each upper inner contiguous metal fill structure (65, 70) comprises a via-level metal structure and a line-level metal structure. Specifically, the via-level metal structure is the third-line-level metal structure 65, and the line-level metal structure is the third-line-level metal structure 70.

Each outer contiguous metal fill structure is a single contiguous structure. Each lower outer contiguous metal fill structure includes a second-via-level metal structure 55' and a second-line-level metal structure 60'. Each upper outer contiguous metal fill structure includes a fourth-via-level metal structure 75' and a fourth-line-level metal structure 80' that overlies the lower outer contiguous metal fill structures (55', 60'). Each upper outer contiguous metal fill structure (75', 80') is vertically separated from the lower outer contiguous metal fill structures (55', 60') by another sub-portion of the second dielectric material portion DMP2. The other sub-portion of the second dielectric material portion DMP2 is located between the second-line-level metal structure 60' and the fourth-via-level metal structure 75'.

The second-via-level metal structure 55' vertically abuts the second-line-level metal structure 60'. The fourth-via-level metal structure 75' vertically abuts the fourth-line-level metal structure 80'. The upper outer contiguous metal fill structures (75', 80') and the lower outer contiguous metal fill structures (55', 60') are collectively referred to as at least two sets of outer contiguous metal fill structures. Each set among the at least two sets of outer contiguous metal fill structures is vertically separated from any other of the at least two sets of outer contiguous metal fill structures by the second dielectric material portion DMP2. The outer contiguous metal fill structures are located on the outer periphery of the first dielectric material portion DMP1.

Each lower outer contiguous metal fill structure (55', 60') comprises a via-level metal structure and a line-level metal structure. In this case, the via-level metal structure is the second-via-level metal structure 55', and the line-level metal structure is the second-line-level metal structure 60'. Each upper outer contiguous metal fill structure (75', 80') also comprises a via-level metal structure and a line-level metal structure. In this case, the via-level metal structure is the fourth-via-level metal structure 75', and the line-level metal structure is the fourth-line-level metal structure 80'.

Each set among the at least two sets of inner contiguous metal fill structures and the at least two sets of outer contiguous metal fill structures comprises a different set of metal interconnect levels from any other set among the at least two sets of inner contiguous metal fill structures and the at least two sets of outer contiguous metal fill structures. Specifically, the lower inner contiguous metal fill structures 50 comprises the set of metal interconnect levels consisting of the first line level. The upper inner contiguous metal fill structures (65, 70) comprises the set of metal interconnect levels consisting of the third via level and third line level. The lower outer contiguous metal fill structures (55', 60') comprises the set of metal interconnect levels consisting of the second via level and the second line level. The upper outer contiguous metal fill structures (75', 80') comprises the set of metal interconnect levels consisting of the fourth via level and the fourth line level. The overall composition of the metal interconnect levels is a staggered set of metal interconnect levels in which there is no vertical overlap between any of the at least two sets of inner contiguous metal fill structures and any of the at least two sets of outer contiguous metal fill structures.

Other sets of contiguous metal fill structures overlying or underlying the inner metal fill structure group 2 of the at least two sets of inner contiguous metal fill structures and the outer metal fill structure group 4 of the at least two second lateral metallic enclosure structure may be formed as in the first embodiment. The third exemplary structure may further comprise a chip guard ring as in the first embodiment. Embodiments of the present invention in which different numbers of via levels and/or different numbers of line levels are explicitly contemplated herein. In this case, each of the at least two sets of inner contiguous metal fill structures in an inner metal fill structure group 2 comprises a different set of metal interconnect levels than any set of metal interconnect levels that constitute an entirety of any of at least two sets of outer contiguous metal fill structures in an outer metal fill structure group 4. The outer metal fill structure group 4 is located outside, and laterally encloses the inner metal fill structure group 2. A variation of the third exemplary structure in which the set of levels employed for the inner metal fill structure group 2 and the set of levels employed for the outer metal fill structure group 4 are exchanged is also explicitly contemplated herein.

Figure 4:
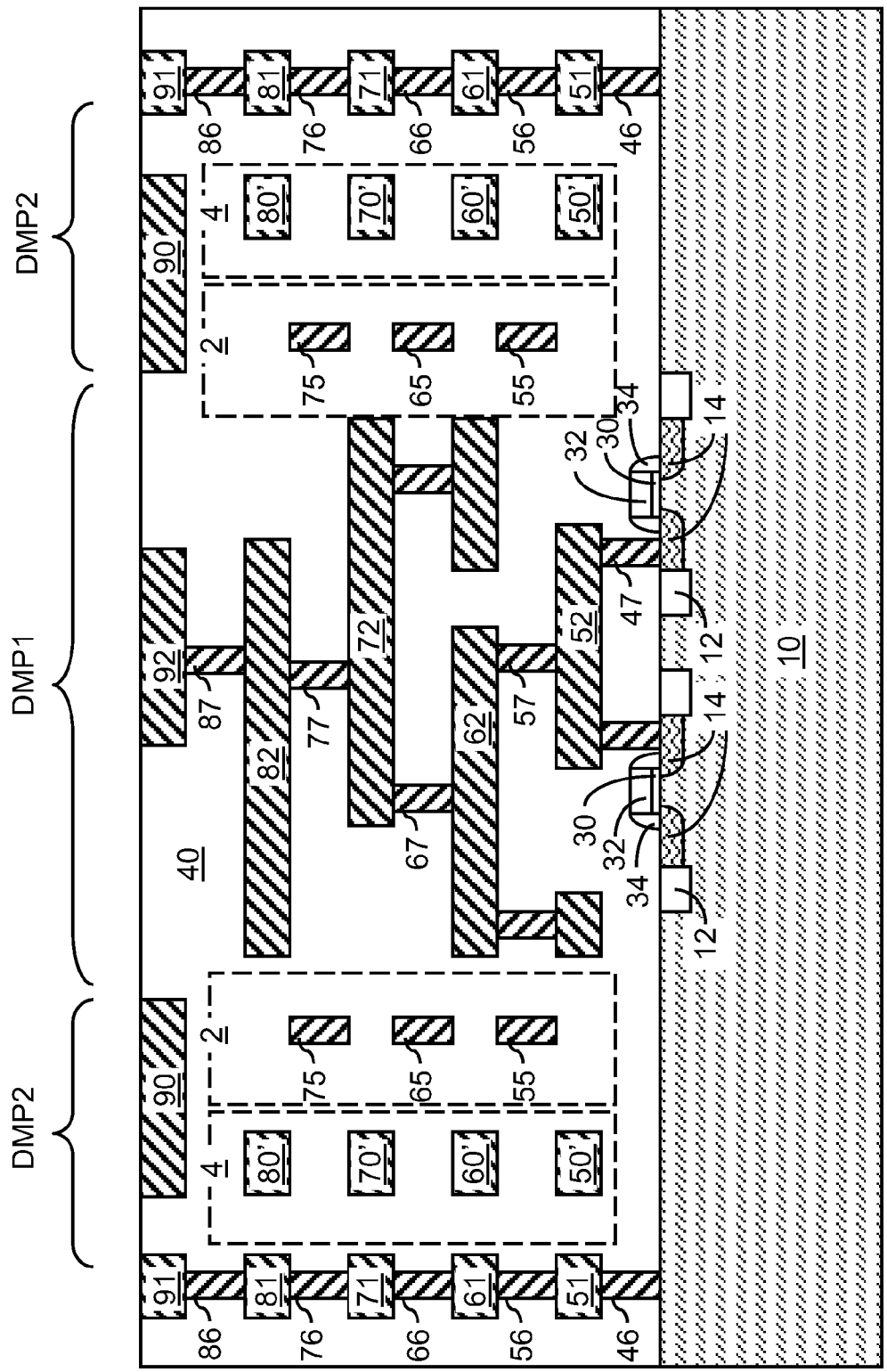
FIG. 4 is a vertical cross-sectional view of a fourth exemplary structure according to a fourth embodiment of the present invention.

Referring to FIG. 4, a fourth exemplary structure according to a fourth embodiment of the present invention comprises a semiconductor substrate 10, which may be the same as in the first embodiment. A semiconductor device may be formed on the semiconductor substrate 10 in the same manner as in the first embodiment.

Dielectric material layers 40 and metal interconnect structures (47, 52, 57, 62, 67, 72, 77, 82, 87, 92) are formed on the top surface of the semiconductor substrate 10 and the optional semiconductor device in the same manner as in the first embodiment. The composition and thickness of each of the dielectric material layers 40 and the metal interconnect structures (47, 52, 57, 62, 67, 72, 77, 82, 87, 92) may be the same as in the first embodiment. The dielectric material layers 40 and the metal interconnect structures (47, 52, 57, 62, 67, 72, 77, 82, 87, 92) may be formed in the same manner as in the first embodiment.

An inner metal fill structure group 2 and an outer metal fill structure group 4 are formed as embedded structures in the dielectric material layers 40. Inner contiguous metal fill structures include second-via-level metal structures 55, third-via-level metal structures 65, and fourth-via-level metal structures 75. Each of the second-via-level metal structure 55, the third-via-level metal structure 65, and the fourth-via-level metal structures 75 overlies or underlies a set of inner contiguous metal fill structures located in another level. Each inner contiguous metal fill structures is vertically separated from the rest of the inner contiguous metal fill structures by portions of the dielectric material layers 40 located outside and laterally surrounding the first dielectric material portion DMP1.

Outer contiguous metal fill structures include first-line-level metal structures 50', second-line-level metal structures 60', third-line-level metal structures 70', and fourth-line-level metal structures 80'. Each of the first-line-level metal structures 50', the second-line-level metal structures 60', the third-line-level metal structures 70', and the fourth-line-level metal structures 80' underlies or overlies a set of outer contiguous metal fill structures located in another level. Each of the outer contiguous metal fill structures is vertically separated from the rest of the outer contiguous metal fill structures by the second dielectric material portion DMP2.

Each inner contiguous metal fill structure consists of a single level via structure, and each outer contiguous metal fill structure consists of a single level line structure. The inner contiguous metal fill structures constitute at least two sets of inner contiguous metal fill structures. Each set of inner contiguous metal fill structures is located in different levels. The outer contiguous metal fill structures constitute at least two sets of outer contiguous metal fill structures. Each set of outer contiguous metal fill structures is located in different levels. Each set among the at least two sets of inner contiguous metal fill structures and the at least two sets of outer contiguous metal fill structures comprises a metal interconnect level that is different from any other metal interconnect level occupied by any other of the at least two sets of inner contiguous metal fill structures and the at least two sets of outer contiguous metal fill structures. The overall composition of the metal interconnect levels is a staggered set of metal interconnect levels in which there is no vertical overlap between any of the at least two sets of inner contiguous metal fill structures and any of the at least two sets of outer contiguous metal fill structures.

Other sets of contiguous metal fill structures overlying or underlying the inner metal fill structure group 2 of the at least two sets of inner contiguous metal fill structures and the outer metal fill structure group 4 of the at least two second lateral metallic enclosure structure may be formed as in the first embodiment. The fourth exemplary structure may further comprise a chip guard ring as in the first embodiment. Embodiments of the present invention in which different numbers of via levels and/or different numbers of line levels are explicitly contemplated herein. In this case, each of the at least two sets of inner contiguous metal fill structures in an inner metal fill structure group 2 comprises a different set of metal interconnect levels than any set of metal interconnect levels that constitute an entirety of any of at least two sets of outer contiguous metal fill structures in an outer metal fill structure group 4. The outer metal fill structure group 4 is located outside, and laterally encloses the inner metal fill structure group 2. A variation of the second exemplary structure in which the set of levels employed for the inner metal fill structure group 2 and the set of levels employed for the outer metal fill structure group 4 are exchanged is also explicitly contemplated herein.

In all embodiments of the present invention, the number of levels within each of the at least two sets of inner contiguous metal fill structures and the at least two sets of outer contiguous metal fill structures is limited no more than 3 metal interconnect levels. In other words, each set of inner contiguous metal fill structures occupying the same level or the same levels is limited no more than 3 metal interconnect levels. Likewise, each set of outer contiguous metal fill structures occupying the same level or the same levels is limited no more than 3 metal interconnect levels. Further, the vertical extent of each set among the at least two sets of inner contiguous metal fill structures and the at least two sets of outer contiguous metal fill structures is thus limited to a number less than the total number of levels in the dielectric material layers 40, which typically includes at least four levels. Capacitive coupling between the metal interconnect structures (47, 52, 57, 62, 67, 72, 77, 82, 87, 92) and the inner and outer contiguous metal fill structures is reduced, while the inner and outer contiguous metal fill structures function as an effective barrier for moisture and impurities. The reduced capacitive coupling enables faster transmission of signals through the metal interconnect structures (47, 52, 57, 62, 67, 72, 77, 82, 87, 92), thereby enhancing the performance of the circuit including the optional semiconductor device and the metal interconnect structures (47, 52, 57, 62, 67, 72, 77, 82, 87, 92).

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure including:
   a first dielectric material portion located directly on a semiconductor substrate;
   a set of metal interconnect structures embedded within, and not extending outside, said first dielectric material portion and providing a least one electrically conductive path between a top surface of said semiconductor substrate to a topmost surface of said first dielectric material portion;

a second dielectric material portion laterally surrounding, and located on an outer periphery of, said first dielectric material portion and not in contact with said set of metal interconnect structures;

an inner metal fill structure group embedded in, and not extending out of, an inner portion of said second dielectric material portion and including at least two sets of inner contiguous metal fill structures that are vertically separated, wherein each inner contiguous metal fill structure includes no more than 3 metal interconnect levels and separated among one another; and an outer metal fill structure group embedded in, and not extending out of, an outer portion of said second dielectric material portion that laterally surrounds said inner portion of said second dielectric material portion and including at least two sets of outer contiguous metal fill structures that are vertically separated, wherein each outer contiguous metal fill structures includes no more than 3 metal interconnect levels and separated among one another, wherein each of said at least two sets of inner contiguous metal fill structures comprises a different set of metal interconnect levels than any set of metal interconnect levels that constitute an entirety of any of said at least two sets of outer contiguous metal fill structures.

2. The semiconductor structure of claim 1, wherein each inner contiguous metal fill structure overlies or underlies another inner contiguous metal fill structure, and wherein each outer contiguous metal fill structure overlies or underlies another outer contiguous metal fill structure.

3. The semiconductor structure of claim 1, wherein each of said inner contiguous metal fill structures and said outer contiguous metal fill structures has a planar topmost surface and a planar bottommost surface.

4. The semiconductor structure of claim 1, wherein said at least two sets of inner contiguous metal fill structures include an inner contiguous metal fill structure having a first line-level metal structure, a via-level metal structure vertically abutting a top surface of said first line-level metal structure, and an second line-level metal structure vertically abutting a top surface of said via-level metal structure.

5. The semiconductor structure of claim 4, wherein said inner contiguous metal fill structure consists of said first line-level metal structure, said via-level metal structure, and said second line-level metal structure.

6. A semiconductor structure including:

a first dielectric material portion located directly on a semiconductor substrate;

an inner metal fill structure group located on a periphery of said first dielectric material portion and including at least two sets of inner contiguous metal fill structures that are vertically separated, wherein each inner contiguous metal fill structure includes no more than 3 metal interconnect levels and separated among one another;

a second dielectric material portion located on an outer periphery of said inner metal fill structure group; and an outer metal fill structure group embedded in said second dielectric material portion and including at least two sets of outer contiguous metal fill structures that are vertically separated, wherein each outer contiguous metal fill structures includes no more than 3 metal interconnect levels and separated among one another, wherein each of said at least two sets of inner contiguous metal fill structures comprises a different set of metal interconnect levels than any set of metal interconnect levels that constitute an entirety of any of said at least two sets of outer contiguous metal fill structures, wherein said at least two sets of inner contiguous metal fill structures include an inner contiguous metal fill structure having a first line-level metal structure, a via-level metal structure vertically abutting a top surface of said first line-level metal structure, and an second line-level metal structure vertically abutting a top surface of said via-level metal structure, and wherein said inner contiguous metal fill structure consists of said first line-level metal structure, said via-level metal structure, and said second line-level metal structure, and wherein said at least two sets of outer contiguous metal fill structures include an outer contiguous metal fill structure having a third line-level metal structure, another via-level metal structure vertically abutting a top surface of said third line-level metal structure, and a fourth line-level metal structure vertically abutting a top surface of said another via-level metal structure, wherein said third line-level metal structure is located at a same level as said second line-level metal structure.

7. A semiconductor structure including:

a first dielectric material portion located directly on a semiconductor substrate;

an inner metal fill structure group located on a periphery of said first dielectric material portion and including at least two sets of inner contiguous metal fill structures that are vertically separated, wherein each inner contiguous metal fill structure includes no more than 3 metal interconnect levels and separated among one another;

a second dielectric material portion located on an outer periphery of said inner metal fill structure group; and an outer metal fill structure group embedded in said second dielectric material portion and including at least two sets of outer contiguous metal fill structures that are vertically separated, wherein each outer contiguous metal fill structures includes no more than 3 metal interconnect levels and separated among one another, wherein each of said at least two sets of inner contiguous metal fill structures comprises a different set of metal interconnect levels than any set of metal interconnect levels that constitute an entirety of any of said at least two sets of outer contiguous metal fill structures, wherein said at least two sets of inner contiguous metal fill structures include an inner contiguous metal fill structure having a first line-level metal structure, a via-level metal structure vertically abutting a top surface of said first line-level metal structure, and an second line-level metal structure vertically abutting a top surface of said via-level metal structure, and wherein said inner contiguous metal fill structure consists of said first line-level metal structure, said via-level metal structure, and said second line-level metal structure, and wherein said at least two sets of outer contiguous metal fill structures include an outer contiguous metal fill structures having a third line-level metal structure, another via-level metal structure vertically abutting a top surface of said third line-level metal structure, and a fourth line-level metal structure vertically abutting a top surface of said another via-level metal structure, wherein said fourth line-level metal structure is located at a same level as said first line-level metal structure.

8. The semiconductor structure of claim 1, wherein said at least two sets of inner contiguous metal fill structures include an inner contiguous metal fill structure having a line-level metal structure and a via-level metal structure, wherein said via-level metal structure vertically abuts a top surface of said line-level metal structure.

9. The semiconductor structure of claim 8, wherein said inner contiguous metal fill structure consists of said line-level metal structure and said via-level metal structure.

10. The semiconductor structure of claim 9, wherein said at least two sets of outer contiguous metal fill structures include an outer contiguous metal fill structure having another line-level metal structure and another via-level metal structure, wherein said another via-level metal structure vertically abuts a bottom surface of said another line-level metal structure, and wherein a top surface of said via-level metal structure is substantially coplanar with a bottom surface of said another line-level metal structure.

11. The semiconductor structure of claim 9, wherein said at least two sets of outer contiguous metal fill structures include an outer contiguous metal fill structure having another line-level metal structure and another via-level metal structure, wherein said another via-level metal structure abuts a top surface of said another line-level metal structure, and wherein a top surface of said other via-level metal structure is substantially coplanar with a bottom surface of said line-level metal structure.

12. The semiconductor structure of claim 1, wherein said at least two sets of inner contiguous metal fill structures include an inner contiguous metal fill structure having a via-level metal structure and a line-level metal structure, wherein said via-level metal structure vertically abuts a bottom surface of said line-level metal structure.

13. The semiconductor structure of claim 12, wherein said inner contiguous metal fill structure consists of said via-level metal structure and said line-level metal structure.

14. The semiconductor structure of claim 13, wherein said at least two sets of outer contiguous metal fill structures include an outer contiguous metal fill structure having another via-level metal structure and another line-level metal structure, wherein said another via-level metal structure vertically abuts a top surface of said another line-level metal structure, and wherein a top surface of said line-level metal structure is substantially coplanar with a bottom surface of said other via-level metal structure.

15. The semiconductor structure of claim 13, wherein said at least two sets of outer contiguous metal fill structures include an outer contiguous metal fill structure having another via-level metal structure and another line-level metal structure, wherein said another via-level metal structure vertically abuts a top surface of said another line-level metal structure, and wherein a top surface of said other line-level metal structure is substantially coplanar with a bottom surface of said via-level metal structure.

16. The semiconductor structure of claim 1, wherein said at least two sets of inner contiguous metal fill structures include an inner contiguous metal fill structures consisting of a single via-level metal structure.

17. The semiconductor structure of claim 16, wherein said at least two sets of outer contiguous metal fill structures include an outer contiguous metal fill structures consisting of a single line-level metal structure, wherein a horizontal surface of said single via-level metal structure and a horizontal surface of said single line-level metal structure are coplanar.

18. The semiconductor structure of claim 1, wherein said at least two sets of outer contiguous metal fill structures include an outer contiguous metal fill structure consisting of a single via-level metal structure.

19. The semiconductor structure of claim 18, wherein said at least two sets of inner contiguous metal fill structures include an inner contiguous metal fill structure consisting of a single line-level metal structure, wherein a horizontal surface of said single via-level metal structure and a horizontal surface of said single line-level metal structure are coplanar.

20. The semiconductor structure of claim 1, further comprising a semiconductor device located on said semiconductor substrate.

* * * * *